(12) United States Patent
Heid

(10) Patent No.: US 6,288,547 B1
(45) Date of Patent: Sep. 11, 2001

(54) METHOD FOR DETERMINING A GRADIENT CURRENT CURVE IN AN MR TOMOGRAPHY APPARATUS, AND APPARATUS FOR IMPLEMENTING THE METHOD

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/576,763

(22) Filed: May 24, 2000

(30) Foreign Application Priority Data

May 5, 1999 (DE) .............................................. 199 23 975

(51) Int. Cl.$^7$ ..................................................... G01V 3/00
(52) U.S. Cl. ........................................... 324/322; 324/307
(58) Field of Search ................................... 324/322, 318, 324/307, 309, 306, 300, 314, 312

(56) References Cited

U.S. PATENT DOCUMENTS

| 4,651,096 | | 3/1987 | Buonocore | 324/309 |
| 5,237,277 | * | 8/1993 | Lenz | 324/322 |
| 5,856,744 | * | 1/1999 | Block et al. | 324/309 |
| 5,914,601 | * | 6/1999 | Goldfarb | 324/322 |

* cited by examiner

*Primary Examiner*—Louis Arana
(74) *Attorney, Agent, or Firm*—Schiff Hardin & Waite

(57) ABSTRACT

In a method for the determination of the curve of the gradient current in an MR tomography device and an MR tomography device operating according to the method, a reference current curve is established for a specific class of pulse sequences, from which the current curve of the gradient current is acquired by scaling in the amplitude axis as well as in the time axis.

7 Claims, 3 Drawing Sheets

METHOD FOR DETERMINING A GRADIENT CURRENT CURVE IN AN MR TOMOGRAPHY APPARATUS, AND APPARATUS FOR IMPLEMENTING THE METHOD

BACKGROUND OF THE INVENTION

1. Field of the Invention

The present invention is directed to a method for determining the curve for a gradient current in a magnetic resonance tomography apparatus, as well as to a magnetic resonance tomography apparatus operating according to the method.

2. Description of the Prior Art

In MR tomography devices, pulse sequences are employed which are generated by gradient currents. Calculating the curve of the gradient current is very complicated. This is particularly true when the k-space is not scanned in straight sections, but instead a general k-space scanning strategy is used. An example of such a sequence is the spiral-imaging method disclosed in the U.S. Pat. No. 4,651,096, wherein the k-space path exhibits a spiral shape.

In order to attain maximum performance of the MR tomography device, effort is made to optimally utilize the gradient system with respect to the slew rate and gradient amplitude. The calculation of complicated differential equations is required for the determination of the curve of the gradient current with these prescriptions as boundary conditions. It would greatly exceed the computing capacity of the currently customary control computers to calculate these equations in realtime during the measurement. For MR devices as are offered, e.g. by Siemens under the name "Magnetom"®, it is therefore customary to calculate a table offline with support values for the curve of the gradient current and to store as the reference current curve for a class of pulse sequences (for example, for the aforementioned spiral-imaging method). Given a change of the measurement field, only the gradient amplitude is then scaled. Since it must be assured that the allowable slew rate is not exceeded, however, one cannot attain an optimal utilization of the gradient system. The reference current curve must be determined such that the scaling does not cause the limit values of the slew rate for any adjustable measurement field to be exceeded.

SUMMARY OF THE INVENTION

An object of the present invention is to provide a method for determining the curve of the gradient current in an MR tomography device, or an MR tomography device that assures an improved utilization of the gradient system.

The above object is achieved in accordance with the principles of the present invention in a method and MR tomography apparatus wherein a reference current curve for a gradient current is established for a class of pulse sequences, and wherein a current curve for a gradient current is obtained from the reference current curve by scaling, for use with a particular pulse sequence, and wherein the scaling takes place, for at least a portion of the pulse sequence being currently used, both in the amplitude axis and in the time axis.

As a result of the scaling of the reference current curve in the amplitude and in the time axis, an improved utilization of the gradient system is attained since the slew rate is not automatically scaled along with the scaling of the gradient amplitude.

The inventive method can be used, e.g. for scaling on the basis of a desired measurement field or for adapting performance data of various MR tomography devices. The sequence that has been calculated once can be employed in between various systems using respectively different performance data.

Scaling of the amplitude and the time axis respectively can ensue by a factor $\sqrt{n}$ given a change of the measurement field by the factor $1/n$. Thus the scaling is divided uniformly on the amplitude axis and the time axis.

Given a pulse sequence with variable amplitude, one can advantageously provide time intervals within the pulse sequence in which an amplitude limitation of the curve of the gradient current is in effect and only a scaling in the time axis ensues. Thus, the desired k-space path can be approached without exceeding the allowable gradient amplitude.

DESCRIPTION OF THE PREFERRED EMBODIMENTS

Figure 1:
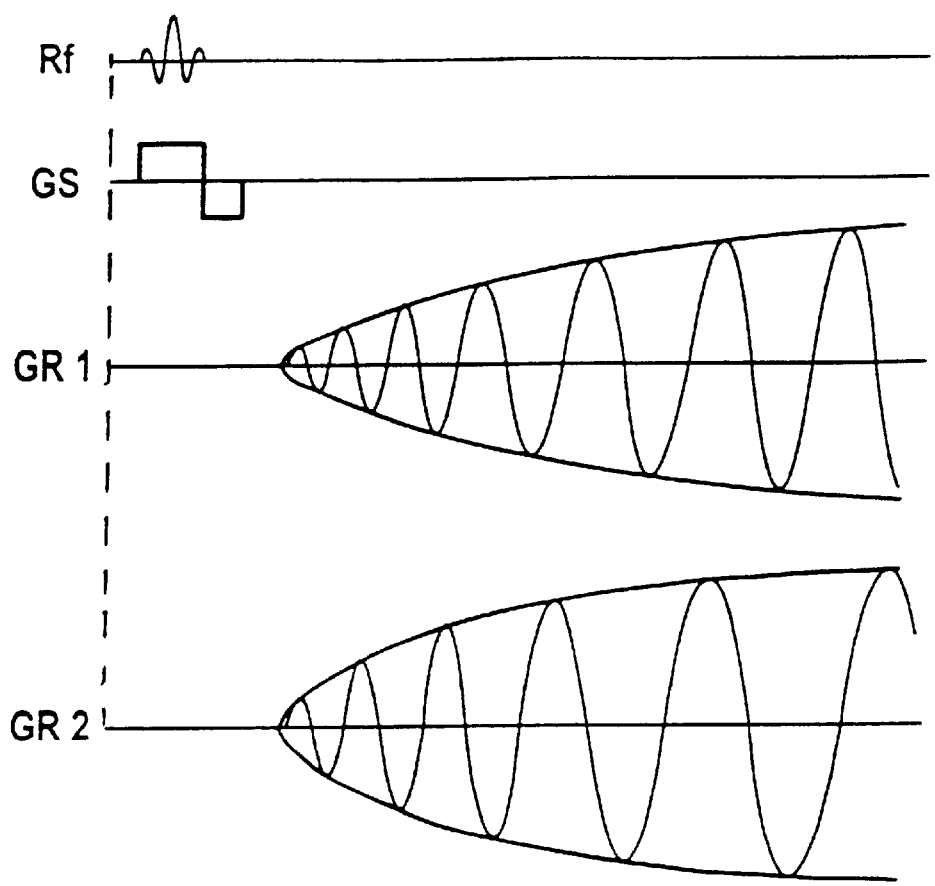
FIG. 1 shows a known pulse sequence according to the spiral-imaging method.
Figure 2:
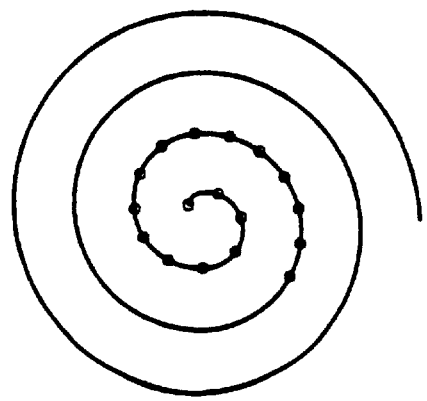
FIG. 2 illustrates the k-space trajectory as is also known for the pulse sequence of FIG. 1.
Figure 3:
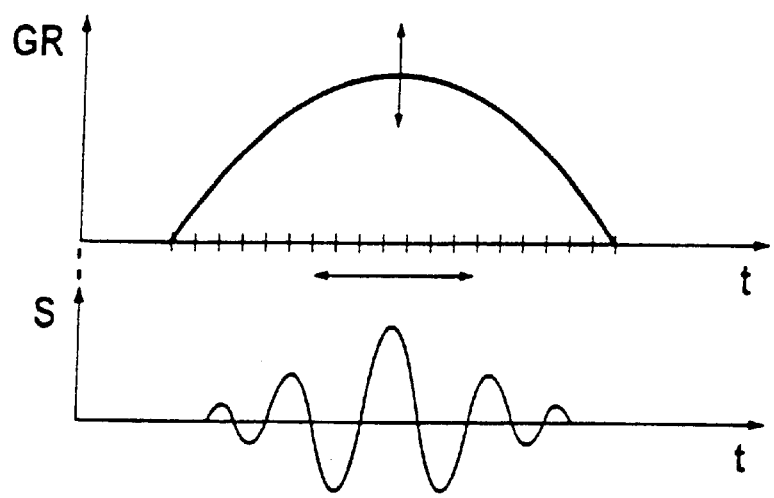
FIG. 3 shows the scanning of a nuclear resonance signal for a half wave of the readout gradient, in accordance with the invention.

In FIG. 1 a pulse sequence known from the initially recited U.S. Pat. No. 4,651,096 is shown according to the spiral-scan method. A high frequency pulse is emitted under the influence of a slice selection gradient GS so that a defined slice of the examination subject is excited. The nuclear resonance signal arising therefrom is read out under time variable readout gradients GR1 and GR2 that stand vertical to one another. These gradients have alternating operational signs so that the nuclear resonance signal as a result is alternatingly refocused and unfocussed multiple times in the direction of the readout gradients GR1, GR2. As explained in more detail in the above recited patent, the gradients GR1 and GR2 are implemented such that the resulting k-space path exhibits a spiral form, i.e. the scan points in the k-space, as shown in FIG. 2, lie on a spiral. The calculation of the curve of the gradient current for this pulse sequence is very complex, especially whenever one wants to maximally utilize the gradient system with respect to amplitude and slew rate. The performance of the MR tomography device, especially with respect to the measurement time, however, depends considerably on the gradient use maximization.

The calculation of the curve of the gradient current therefore does not ensue in realtime, i.e. during the sequence run, but rather the gradient current form is precalculated once and stored in a table. The stored values cannot be directly used for each pulse sequence. In particular, an adaptation must ensue given a change of the measurement window FOV (field of view). The measurement window FOV and the resolution As are defined according to the following equation:

$$FOV = \frac{1}{\gamma G(t) \cdot \Delta \tau} \quad (1)$$

$$\Delta s = \frac{1}{\gamma G(t) \cdot \Delta \tau \cdot N} \quad (2)$$

wherein
FOV is the size of the measurement window,
y is the gyromagnetic constant,
G(t) is the gradient amplitude,
ΔT is the distance between the two scan points, and
N is the number of scan points for a nuclear resonance signal.

In known systems, only the stored reference current curve was scaled with respect to the amplitude to change the measurement field FOV. For example, the amplitude G of the gradient was doubled in the respective direction given a halved measurement window FOV. The slew rate also doubles, of course, given conditions that are otherwise the same. In order to avoid exceeding the limiting values prescribed by the gradient system, the stored reference current curve would have to be implemented such that system-specified limit values are not exceeded under any circumstances in the scaling of the amplitude. However, an optimal utilization of the curve of the gradient current is then possible only given a minimally adjustable measurement field, but the gradient system is no longer optimally utilized in all other operating conditions.

According to the invention, not only the gradient amplitude is scaled, but also the time scale of the reference curve is simultaneously scaled, as is schematically shown for a half wave of the gradient pulse. For e.g. halving of the measurement window, then the time axis, i.e. the distance ΔT between the two scan points, and the amplitude are respectively scaled by the factor √2. The above indicated equation (1) for the measurement window then results in the measurement window being halved. The scaling on the time axis not only leads to a corresponding change of the distance AT between two scan points, but also to a change of the corresponding gradient pulse length. Alternatively, however, one could also retain the gradient pulse length and thus reduce the number N of the scan points. This would, however, cause a loss in resolution As according to the above indicated equation (2).

No changes of the slew rate arise as a result of the scaling of both the amplitude and the time axis—in so far as the scaling is performed uniformly. Thus the reference current curve can be defined such that the gradient system is optimally utilized with respect to the slew rate without having the danger of slipping into unallowable ranges of the slew rate in a scaling. As with conventional methods, one merely needs to pay attention to maintaining amplitude limits for the curve of the gradient current. This is explained in more detail in the following on the basis of FIG. 4.

Figure 4:
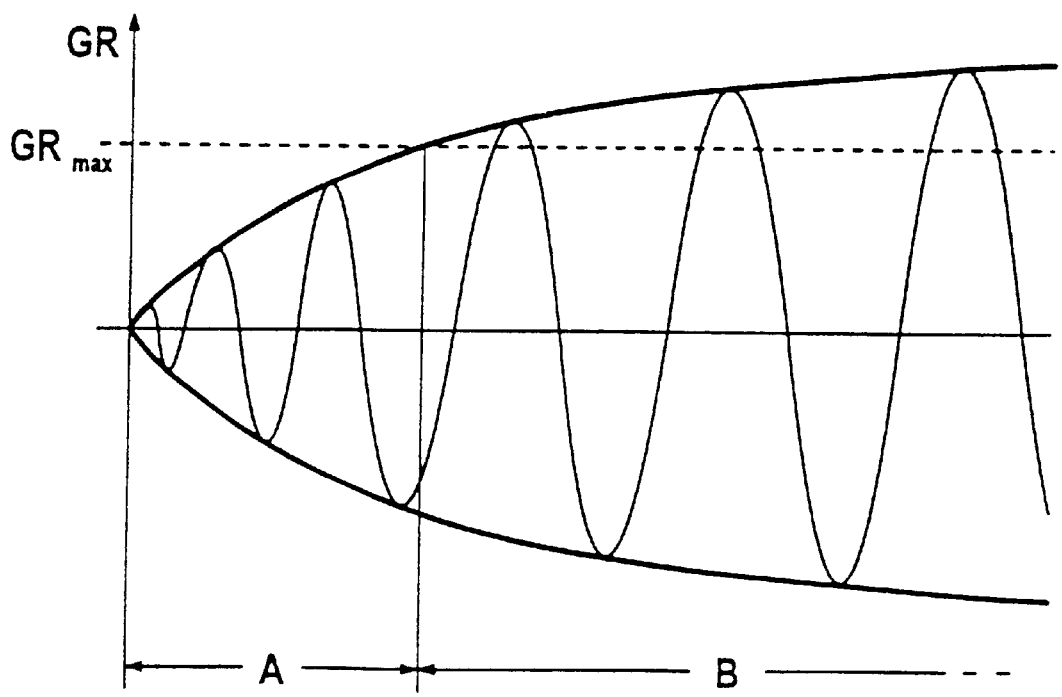
FIG. 4 shows the effect of the amplitude limitation produced by the scanner of FIG. 3.

FIG. 4 shows the current flow for a gradient coil corresponding to FIG. 1, in an enlarged representation. The maximum gradient current amplitude $GR_{max}$ would be exceeded given the operating case shown in FIG. 4 as a result of the curve of the gradient current increasing in amplitude for the spiral imaging. The curve of the gradient current is therefore divided on the time axis into an area A and an area B. In the area A, the gradient amplitude as well as the time axis, i.e. the duration of the gradient and the time interval ΔT between the two scan points, is scaled corresponding to the desired measurement field FOV. The slew rate remains unmodified in this area. In area B on the other hand, an amplitude limitation is reached, i.e. the amplitude remains unchanged, namely at its maximum allowable value. Only the time axis is scaled. The boundary between the areas A and B, where the amplitude limitation is reached, changes with the measurement field. Given a change of the measurement field, an optimal utilization of the capacity of the gradient system also can be reached, with little outlay, by means of the method presented above on the basis of a simple, piece by piece, linear change of the time scale, e.g. by interpolation of a reference pulse form calculated for each of the two areas A and B.

The same method can also be employed for a change of the performance data of the gradient system, e.g. whenever one wants to produce the precalculated pulse sequence with different gradient systems with respectively different performance data. In addition, the method presented herein can be applied not only to readout gradients, but also to selection gradients, whenever these are selective in three dimensions. The scaling of the time axis can ensue in a simple fashion by means of a time grid of the analog-to-digital converter, whereby a fine tuning ensues, as warranted, by means of the conventional scaling.

Figure 5:
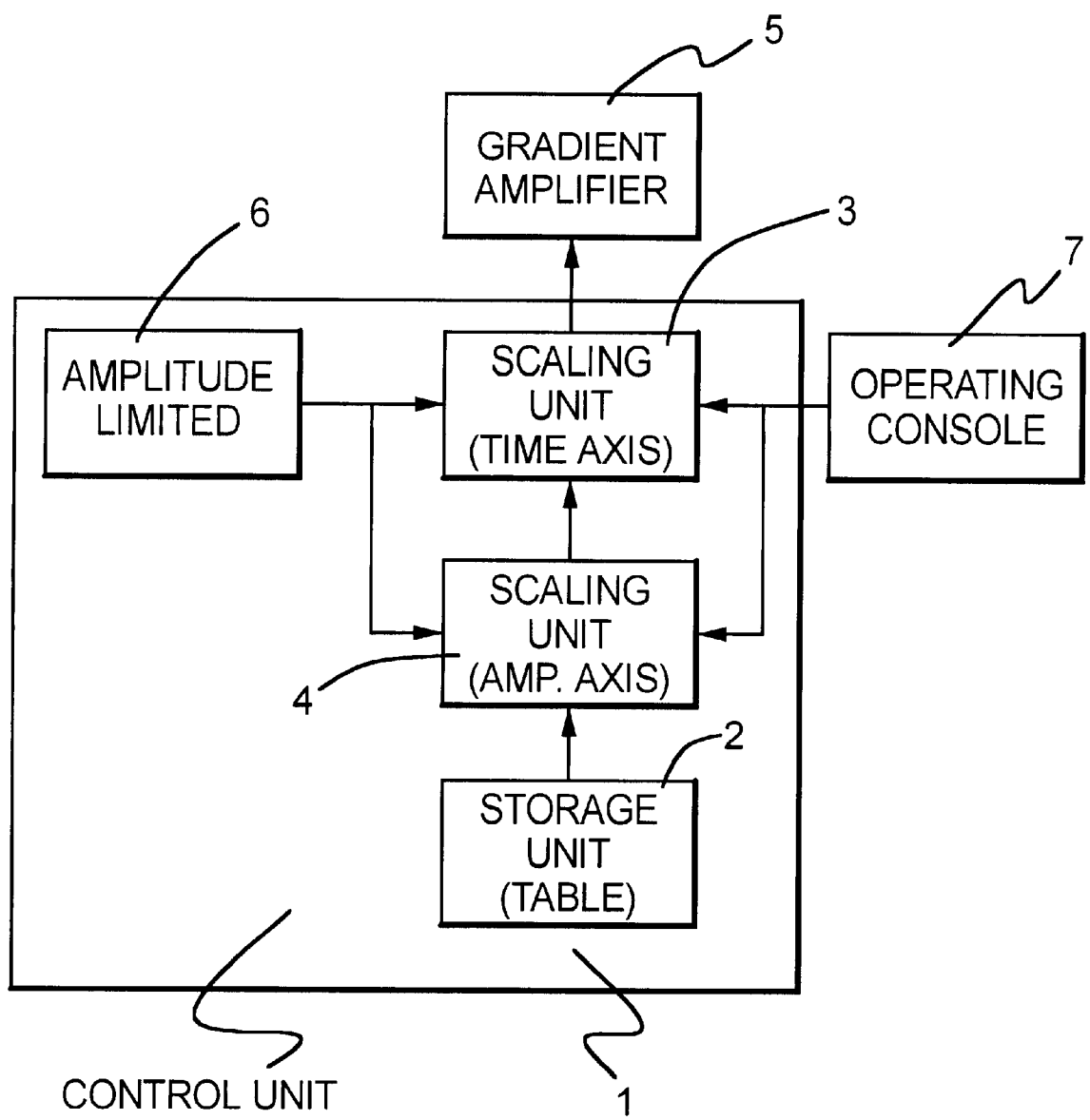
FIG. 5 is a schematic block diagram of an apparatus for the implementation of the method.

FIG. 5 schematically shows an apparatus for the implementation of the method. In a control unit 1, storage unit 2 os provided that contains at least one table with the precalculated curve for the gradient current. On the basis of this table, theoretical values for the curve of the gradient current are produced via scaling units 3 and 4 for amplitude and time respectively. These theoretical values are fed to a gradient amplifier 5. Furthermore, a limiter 6 acts on the scaling units 3 and 4 to limit the amplitude. The scaling units 3 and 4 operate dependent on pulse sequences and sequence parameters that can be prescribed via an operating console 7. Furthermore, the applicable table (for the precalculated curves of the gradient current) is selected via the operating console 7.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining a curve for a gradient current in a magnetic resonance tomography apparatus with arbitrary k-space scanning, said gradient current being used in a pulse sequence for operating said magnetic resonance tomography apparatus, said method comprising the steps of:

establishing a reference current curve, relative to an amplitude axis and a time axis, for a gradient current for a class of pulse sequences;

scaling said reference current curve to obtain a gradient current curve for use in one of said pulse sequences; and conducting said scaling for at least a part of said one of said pulse sequences by scaling in said amplitude axis and scaling in said time axis.

2. A method as claimed in claim 1 comprising the additional step of defining a measurement field, and wherein the step of conducting said scaling comprises conducting said scaling dependent on said measurement field.

3. A method as claimed in claim 1 comprising the additional step of identifying selected performance data for a magnetic resonance tomography apparatus in which said one of said pulse sequences is executed; and conducting said scaling dependent on said performance data.

4. A method as claimed in claim 1 comprising the additional step of:

defining a measurement field and changing said measurement field by a factor 1/n; and conducting said scaling by scaling said reference current curve in said amplitude axis by a factor $\sqrt{n}$ and scaling in said time axis by said factor $\sqrt{n}$.

5. A method as claimed in claim 1 wherein said one of said pulse sequences includes a plurality of time sections wherein said gradient current must be limited in amplitude, and in said time sections conducting said scaling only in said time axis.

6. A magnetic resonance tomography apparatus comprising:

a gradient system having a plurality of gradient coils, which produces a pulse sequence from gradient currents respectively supplied to said gradient coils;

a storage device for storing at least one predetermined reference current curve for a gradient current for a gradient coil, said reference current curve being defined relative to an amplitude axis and a time axis; and a computer unit for calculating a gradient current for use in said pulse sequence by scaling said reference current curve in said amplitude axis and in said time axis.

7. A magnetic resonance tomography apparatus as claimed in claim 6 wherein said computer unit selectively employs an amplitude limitation for said gradient current in scaling said reference current curve.

\* \* \* \* \*